United States Patent [19]

Booth et al.

[11] Patent Number: 5,386,627
[45] Date of Patent: Feb. 7, 1995

[54] METHOD OF FABRICATING A MULTI-LAYER INTEGRATED CIRCUIT CHIP INTERPOSER

[75] Inventors: Richard B. Booth, Wappingers Falls; Robert H. Gephard, Poughkeepsie; Bradley S. Gremban, Lake Katrine, all of N.Y.; Janet E. Poetzinger, Rochester, Minn.; David T. Shen, Poughkeepsie, N.Y.

[73] Assignee: International Business Machines Corporation, Armonk, N.Y.

[21] Appl. No.: 154,225

[22] Filed: Nov. 17, 1993

Related U.S. Application Data

[62] Division of Ser. No. 953,427, Sep. 29, 1992, abandoned.

[51] Int. Cl.⁶ .......................... H05K 3/46; H05K 3/42
[52] U.S. Cl. .......................... 29/852; 29/830; 156/902
[58] Field of Search ............ 29/830, 831, 846, 852; 156/630, 635, 902; 257/416; 361/321.4, 718; 427/97

[56] References Cited

U.S. PATENT DOCUMENTS

| | | | |
|---|---|---|---|
| 4,050,756 | 9/1977 | Moore | 339/59 |
| 4,191,789 | 3/1980 | Brown et al. | 427/97 |
| 4,268,956 | 5/1981 | Parks et al. | 29/869 |
| 4,373,363 | 5/1983 | Hayakawa et al. | 29/847 |
| 4,438,561 | 3/1984 | Mueller | 29/831 |
| 4,617,730 | 10/1986 | Geldermans et al. | 29/843 |
| 4,713,494 | 12/1987 | Oikawa et al. | 174/68.5 |
| 4,788,767 | 12/1988 | Desai et al. | 29/830 |
| 4,908,940 | 3/1990 | Amano | 29/852 |
| 4,935,584 | 6/1990 | Boggs | 174/262 |
| 5,027,253 | 6/1991 | Lauffer et al. | 257/916 X |
| 5,224,265 | 7/1993 | Dux et al. | 29/846 X |
| 5,232,548 | 8/1993 | Ehrenberg | 156/902 X |
| 5,282,312 | 2/1994 | DiStefano et al. | 427/97 X |

FOREIGN PATENT DOCUMENTS

| | | | |
|---|---|---|---|
| 89587 | 4/1989 | Japan | 29/852 |
| 2106091 | 4/1990 | Japan | 29/852 |
| 4108986 | 9/1991 | Japan | 29/830 |

*Primary Examiner*—Peter Dungba Vo
*Attorney, Agent, or Firm*—Charles W. Peterson, Jr.

[57] ABSTRACT

A multilayer, high yield and high density integrated circuit (IC) chips interposer and the method of manufacture therefore. A thin polyimide film is circuitized with copper on both sides. One side may be reserved for power or ground with the opposite side being a signal plane. Adhesive is laminated over both sides covering the circuit patterns. Vias are drilled through at least one adhesive surface, and through the polyimide film. Metal (copper) is blanket sputtered to coat the via walls. Polymer Metal Conductive (PMC) paste is screened to at least partially fill the vias. The Blanket metal is subetched using the screened PMC as a mask. Layers are stacked to form the interposer with the PMC bonding the stacked layers together and electrically interconnecting between layers.

7 Claims, 3 Drawing Sheets

METHOD OF FABRICATING A MULTI-LAYER INTEGRATED CIRCUIT CHIP INTERPOSER

This application is a divisional of Ser. No. 07/953,427, filed on Sep. 29, 1992, now abandoned.

FIELD OF THE INVENTION

The present invention relates to integrated circuit packaging and in particular, to a multilayer structure with three dimensional wiring for connecting one or more integrated circuit chips mounted thereon to a substrate or to a printed circuit card.

BACKGROUND OF THE INVENTION

The Tape Automated Bonding (TAB) is known in the art as a method of connecting integrated chips to a substrate. In Tape Automated Bonding, a low density wiring structure, adhesively attached to a tape, is ultrasonically bonded to an integrated circuit chip. The TAB wires or lands fan out from the chip to provide a larger bonding array for connecting the chip to the next level of packaging, such as a card or module. TAB is a very inexpensive bonding method.

However, because a misbonded TAB mounted chip cannot be detached and rebonded, TAB bonded chip packages are not repairable. TAB bonded chips are not repairable because bonding and breaking that bond damages the TAB lands and may cause physical damage to the chip. Furthermore, TAB mounting expands the chip footprint, increasing the area required for each TAB mounted chip. Expanding the chip footprint clearly conflicts with the integrated circuit chip design goal of packing more circuits into smaller spaces.

Integrated circuit chips mounted on multilayer interposers are known in the art. For example, see U.S. Pat. No. 4,617,730 to Geldermans et al., assigned to the assignee of this invention and incorporated herein by reference. For density, chips are usually attached to the interposer by solder balls, known as Controlled Collapsible Chip Connections (C4's) located at every chip pad. Chips thus mounted are remountable.

However, these prior art interposers are complicated and expensive. One reason that these interposers are expensive, is the way they are manufactured, i.e. one interposer layer at a time. Each subsequent layer is stacked onto previous layers until the interposer is complete. Another reason is that these prior art interposers cannot be tested at intermediate manufacturing steps. SO, defects in an interposer that occur in an early layer (and, therefore, in an early stage) are not detected until the interposer is complete. Even if every interposer manufactured were to test good, these interposers would be expensive because of this complex, time consuming, manufacturing process.

However, not every interposer tests good. Instead, some interposers are defective. As noted above, defects may occur at any layer (at any stage of manufacture) to render the interposer useless. These defects, undetectable prior to completion of the entire interposer, inflate the cost of usable interposers. The yield for an interposer is the product of the yield at each individual stage. The cost of manufacturing good interposers is the cost of manufacturing all interposers divided by interposer yield. For example, an interposer with 15 manufacturing steps or stages, each with a 95% manufacturing stage yield has an overall interposer yield of $(0.95)^{15} = 0.4633 - 46.33\%$ yield, or less than 1 in 2 thus doubling the cost required if only good interposers were manufactured.

Besides reduced yield, these prior art multilayer interposers cannot be modified for Engineering Changes (EC) quickly. So, there is a long delay inherent in EC'ing a multichip package when the changes are in a prior art interposer's wiring. This long delay makes these prior art multilayer interposers unsuitable for any application where short EC turnaround time is critical such as in development.

Finally, although these prior art multilayer interposers provide a much denser packaging alternative to TAB mounted packaging, the wiring dimensions are relatively unstable. To provide stability, the wiring is built on a stiffener such as ceramic, which adds to the cost and complexity of the interposer. Wiring dimensions stability is important because they determine minimum feature size and feature tolerances, which in turn determines packaging density and yield. Larger features mean a larger, less dense package. Wider tolerances also mean a less dense package or, alternatively, lower yield.

It is, therefore, desirable to reduce integrated circuit chip package costs.

It is desirable to reduce multiple chip integrated circuit chip package costs.

It is desirable to reduce multiple chip integrated circuit chip interposer costs.

It is desirable to improve multiple integrated circuit chip packaging density.

It is desirable to improve integrated circuit interposer chip density.

It is desirable to improve integrated circuit chip interposer yield.

It is desirable to reduce interposer fabrication time.

It is desirable to reduce the time required to modify an interposer design.

It is desirable to improve integrated circuit chip interposer yield while reducing interposer fabrication time.

It is desirable to reduce chip interposer cost, fabrication time and improve packaging density, while improving interposer yield.

SUMMARY OF THE INVENTION

The present invention is a method of fabricating a low cost multi-layer integrated circuit interposer; the interposer made according to that method; and, an integrated circuit chip module, or assembly containing that interposer. The interposer has at least one layer of polyimide with wiring patterns etched in metal on both its top and bottom surfaces. An adhesive layer is applied over the metal to cover both surfaces. Via holes are drilled through one adhesive layer surface through the polyimide layer to the other adhesive surface. Metal is blanket sputtered, covering the adhesive surfaces, any exposed metal and, in particular, via side walls. Conductive adhesive paste is screened onto both surfaces to at least partially fill the vias. Using the screened adhesive paste as a mask, the blanket metal is sub-etched away exposing the underlying adhesive layer. All of the layers of an interposer may be thus prepared in parallel and, then, stacked to form the multilayer interposer. The resulting multi-layer interposer has three dimensional wiring. The interposer with integrated circuit chips mounted thereon is mounted on a substrate, packaged in a low-cost package, or, may be mounted directly on a printed circuit card.

DETAILED DESCRIPTION OF THE PREFERRED EMBODIMENT

Figure 1A:
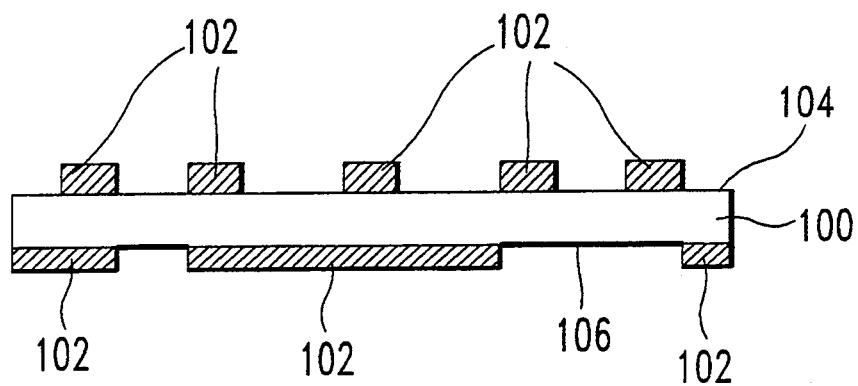
FIGS. 1A–1F, are the process steps for fabricating an interposer layer according to the preferred embodiment.

FIGS. 1A–1F illustrate the steps in fabricating a single interposer layer according to the preferred embodiment method of the present invention. First, in FIG. 1A, a di-electric layer 100 of cured polyimide film 100 has circuit patterns 102 provided on both its top 104 and bottom 106 surfaces. Methods of thus providing circuit patterns are called circuitization in the art. Circuitization processes include sub-etching the circuit pattern into a metal layer; and plating metal through a photoresist mask, called the plate up process. In the preferred embodiment of the present invention, the plate up process is used. The plate up process involves first depositing a blanket layer of metal, forming a photoresist pattern on the blanket layer and, then, plating exposed metal in a standard plating bath. The preferred plating metal is copper, although any suitable metal or electrically conductive material may be used. In the preferred embodiment, for dimensional stability, one circuitized plane, either the top or bottom side, is a signal distribution plane and the other circuitized side is a power or ground plane. So, for example, the top side 106 is a signal distribution plane, while the bottom side 104 is a power plane, ground plane or a reference voltage plane.

Figure 1B:
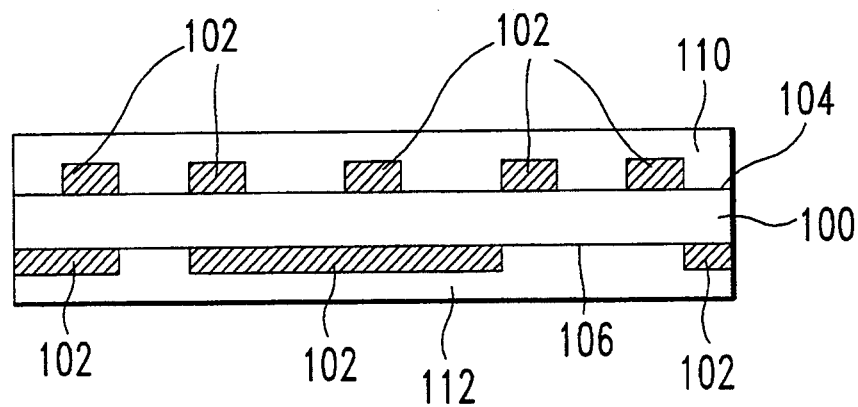

Second, in FIG 1B, adhesive layers 110 and 112 are applied to each side 104 and 106. Any non-conductive adhesive material, suitable for polyimide layer lamination may be used. In the preferred embodiment, the adhesive material is a soluble thermoplastic material of polyimide with siloxane side groups. The soluble thermoplastic material of the preferred embodiment of the present invention is chosen such that the interposer may be laminated and thermally delaminated.

Figure 1C:
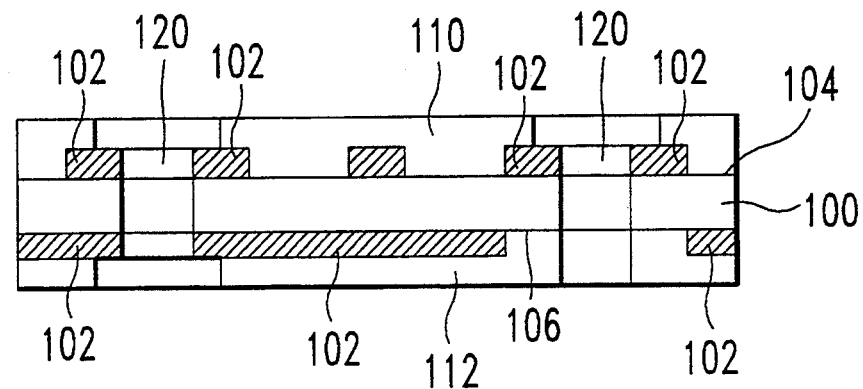

Third, in FIG. 1C, vias 120 are drilled. In the preferred embodiment, drilling is done with an Excimer Laser, although a $CO_2$ laser, a mechanical drill, or other suitable drilling technique may be employed.

Figure 1D:
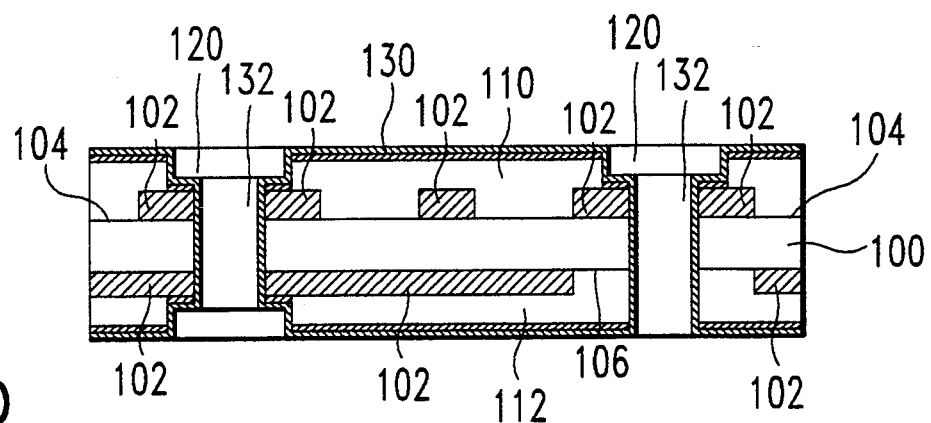

Fourth, in FIG. 1D, metal 130 is blanket sputtered onto both sides 104, 106 to fully plate the interior of the vias 120.

Figure 1E:
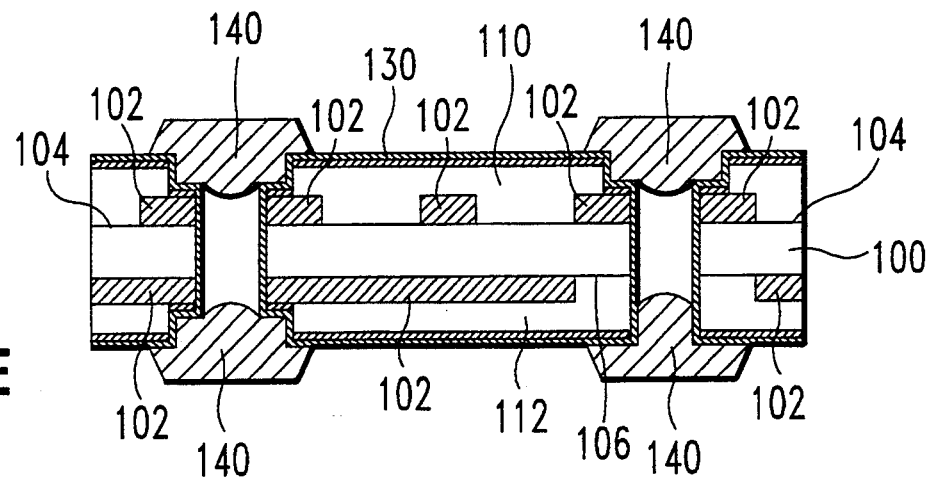

Fifth, in FIG. 1E, Polymer Metal Conductive Paste (PMC) 140 is screened into the via openings 120. The PMC 140, which also has adhesive properties, is a thermoplastic adhesive containing gold or silver, and provides an etch mask to protect the vias during subsequent etching of exposed blanket metal 130. The thermoplastic polymer is selected such that it is soluble, screenable, thermally stable to 360° C. and adheres well to metal (Cu, Au, Sn, Cr) surfaces when laminated above the glass transition temperature (Tg) of the thermoplastic polymer.

Figure 1F:
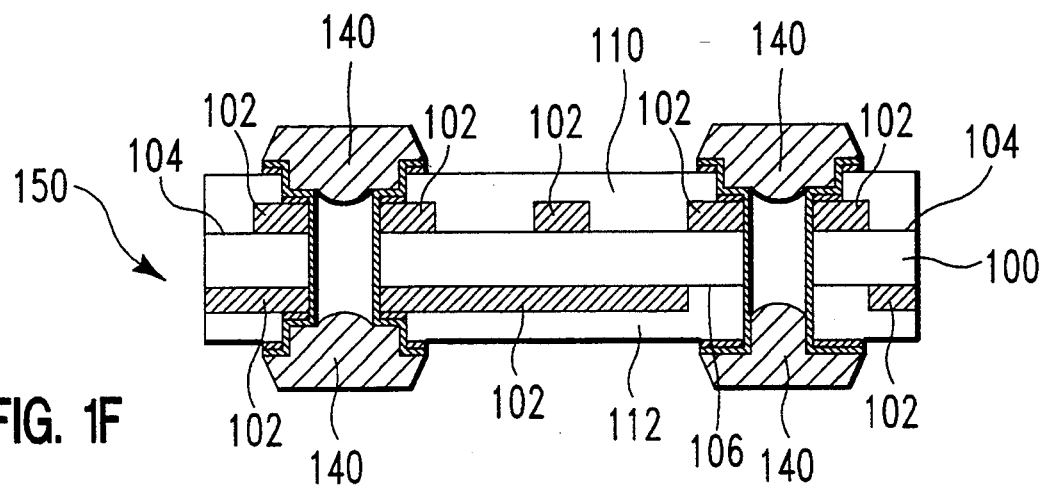

Sixth, in FIG. 1F, the blanket metal 130 is sub-etched using the screened PMC 140 as an etch mask. As a result, all of the blanket metal 130 is removed from the adhesive layers 110, 112, but not the Vias 120 which are metal plated completing interposer layer 150.

Figure 2:
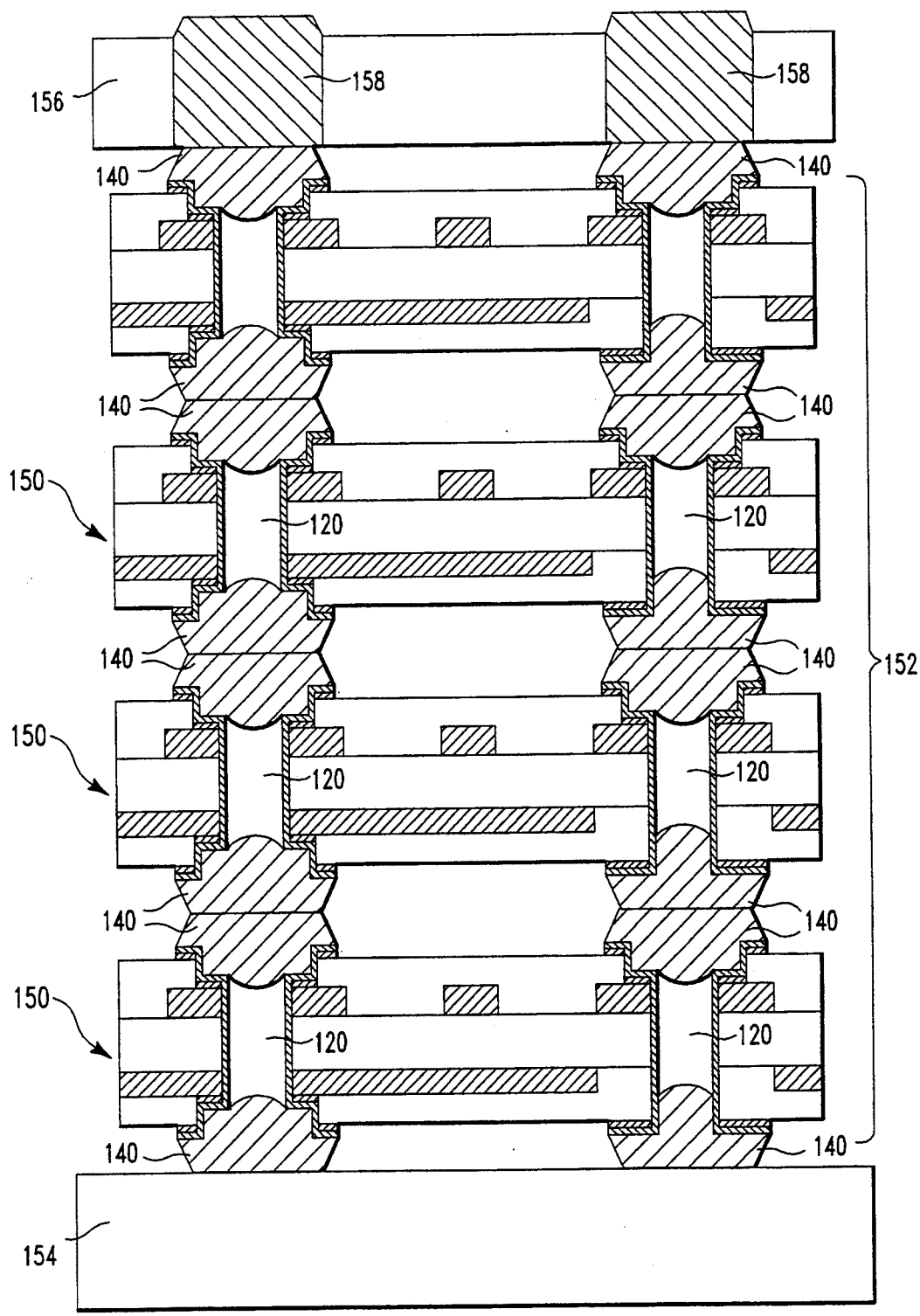
FIG. 2 is a cross sectional view of the preferred embodiment interposer mounted on a packaging component.

The completed interposer layer 150 may be fully tested for defects. FIG. 2 is an example of a preferred embodiment interposer made from 4 such interposer layers 150. The screened PMC 140 capping the vias 120 on each interposer layer 150 glues the interposer's layers 150 together and electrically connects inter layer wiring. Thus, each interposer layer 150 has at least one two dimensional wiring layer with the interconnection third dimension provided by the vias 120. The stack of interposer layers form the interposer 152. The interposer 152 may be reworked by applying heat and pulling the layers apart, delaminating it. Any adhesive residue may be removed with a solvent. The modified interposer layer(s) are discarded and replaced. The delaminated interposer layers and the replaced layer(s) then may be relaminated by following steps identical to those for initially laminating interposer layers.

In this preferred embodiment, the interposer 152 which is mounted on a substrate 154, is capped with a capping layer 156. The capping layer 156 is made by coating one side of a thin polyimide layer with copper, lasing holes through the polyimide, electroplating the exposed copper to form metal caps 158 (as in the plate up process) and, then, etching away the copper coat. Chips are mounted to the capping layer 156 by the metal caps 158. Alternatively, the interposer may be mounted to flex wiring or directly to a printed circuit card with this same conductive adhesive.

Thus, it can be seen that the present invention improves integrated circuit interposer yield because each interposer layer can be tested individually before being bonded to other layers. By improving interposer yield, interposer cost is reduced, which in turn reduces module cost. The present invention reduces manufacturing time because all of the layers of the interposer can be manufactured in parallel (at the same time), and then assembled. So, fabricating an entire interposer takes only slightly longer than fabricating an interposer layer, a fraction of the time required for prior art interposers.

Furthermore, for the same reason, the present invention reduces EC time. To EC the interposer, first it is delaminated, and cleaned. Then, the interposer layer(s) may be replaced and the interposer relaminated. Since new layers may be made in parallel, modifying the interposer only takes the time needed to fabricate a new layer and relaminate the layers.

Consequently, because of improved yield, an improved simple method for making EC's and reduced turnaround time, interposer manufacturing costs are reduced.

Finally, by making one of the circuitized sides of each layer a power or ground layer, wiring dimensions are stabilized. Because the power or ground layer is a relatively uniform layer of metal, that layer of metal holds dimensions and features constant throughout the interposer layer. Also, because the circuit patterns are covered with thermoplastic film, some feature variation is allowable without causing shorts (which would otherwise occur) between the screened PMC 140 and any of the interposer layer's circuit patterns. Thus, layer to layer allignment becomes less critical, relaxing alignment tolerances.

Variations of the preferred embodiment of the present invention will occur to a person of ordinary skill in the Art without departing from the spirit and scope of this invention.

We claim:

1. A method of fabricating an integrated circuit chip interposer having at least one interposer layer, said interposer layer formed by the steps of:

a) forming a di-electric layer of an insulating material,
b) circuitizing a top surface and a bottom surface of said di-electric layer;
c) laminating an adhesive layer over said circuitized surfaces;
d) drilling said di-electric layer, thereby forming a plurality of vias, each of said vias having a wall extending through said di-electric layer;
e) blanket sputtering a conductive material thereby coating each said wall of said plurality of vias with said conductive material;
f) screening a conductive paste into said vias; and,
g) sub-etching said conductive material from said adhesive layer.

2. The method of forming an interposer of claim 1 wherein said screened conductive paste is an etch mask for said sub-etching Step g).

3. The method of forming an interposer of claim 1 wherein the circuitizing step b) comprises:
   i) depositing a layer of metal on said top surface and said bottom surface; and,
   ii) etching a circuit patterns into said deposited metal layers.

4. The method of claim 1 wherein the circuitizing step b) comprises:
   i) coating said di-electric layer with a conductive material;
   ii) coating said conductive material with a photo resistive material;
   iii) forming a circuit pattern in said photo resistive coating; and
   iv) electroplating said circuit pattern onto said conductive material.

5. The method of claim 4 wherein the circuitizing step b) further comprises the steps of:
   v) removing said photo resistive material to expose conductive coating; and
   vi) sub-etching said exposed conductive coating.

6. The method of forming an interposer of claim 1 wherein the vias are drilled with an Excimer laser.

7. The method of forming an integrated circuit chip interposer of claim 1 further comprising stacking a plurality of interposer layers, said interposer layers formed according to steps a)–h), and said conductive paste forming a bond between adjacent said stacked layers.

* * * * *